(12) United States Patent
Xing et al.

(10) Patent No.: US 11,430,932 B2
(45) Date of Patent: Aug. 30, 2022

(54) DRIVING BACKPLANE, MICRO-LED DISPLAY PANEL AND DISPLAY DEVICES

(71) Applicant: CHENGDU VISTAR OPTOELECTRONICS CO., LTD., Chengdu (CN)

(72) Inventors: Rubo Xing, Kunshan (CN); Dong Wei, Kunshan (CN); Xiaolong Yang, Kunshan (CN); Qi Shan, Kunshan (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 0 days.

(21) Appl. No.: 16/705,243

(22) Filed: Dec. 6, 2019

(65) Prior Publication Data
US 2020/0111941 A1 Apr. 9, 2020

Related U.S. Application Data

(63) Continuation of application No. PCT/CN2018/098604, filed on Aug. 3, 2018.

(30) Foreign Application Priority Data

Mar. 29, 2018 (CN) .......................... 201820440383.8

(51) Int. Cl.
*H01L 33/62* (2010.01)
*G09G 3/32* (2016.01)
(Continued)

(52) U.S. Cl.
CPC ............... *H01L 33/62* (2013.01); *G09G 3/32* (2013.01); *H01L 25/0753* (2013.01);
(Continued)

(58) Field of Classification Search
CPC ....... H01L 33/38; H01L 33/387; H01L 33/36; H01L 27/153; H01L 27/156; G09G 3/32
See application file for complete search history.

(56) References Cited

U.S. PATENT DOCUMENTS 9,582,110 B2   2/2017   Zhan et al.
9,930,277 B2   3/2018   Cok
(Continued)

FOREIGN PATENT DOCUMENTS

CN    104461147 A    3/2015
CN    106206651 A    12/2016
(Continued)

OTHER PUBLICATIONS

International Search Report dated Nov. 14, 2018 in the corresponding international application (application No. PCT/CN2018/098604).

*Primary Examiner* — Phat X Cao
(74) *Attorney, Agent, or Firm* — Kilpatrick Townsend & Stockton

(57) ABSTRACT

The present disclosure relates to a driving backplane, a micro-LED display panel and a micro-LED display device. The driving backplane, includes a plurality of pixel units arranged in an array, each of the pixel units comprising: an anode lead; a cathode lead at a side of the anode lead; and at least two pairs of electrodes, each pair of electrodes of the at least two pairs of electrodes including an anode and a cathode oppositely disposed, the anode being electrically connected to the anode lead, and the cathode being electrically connected to the cathode lead. In the course of using the foregoing driving backplane of the micro-LED display panel, it is only necessary to solder an LED chip on one pair of electrodes of the at least two pairs of electrodes.

12 Claims, 3 Drawing Sheets

(51) Int. Cl.
*H01L 27/15* (2006.01)
*H01L 33/36* (2010.01)
*H01L 25/075* (2006.01)
*H01L 33/38* (2010.01)

(52) U.S. Cl.
CPC .......... *H01L 27/153* (2013.01); *H01L 27/156* (2013.01); *H01L 33/36* (2013.01); *H01L 33/387* (2013.01)

(56) References Cited

U.S. PATENT DOCUMENTS

| | | |
|---|---|---|
| 10,043,788 B1 | 8/2018 | Han |
| 10,269,779 B2 | 4/2019 | Lu |
| 2011/0204387 A1* | 8/2011 | Kim ...................... H01L 27/156 257/88 |
| 2016/0351457 A1* | 12/2016 | Chen ....................... H01L 33/44 |
| 2017/0103966 A1* | 4/2017 | Choi ........................ H01L 24/81 |
| 2017/0186740 A1* | 6/2017 | Cok ......................... H01L 22/14 |
| 2018/0019369 A1* | 1/2018 | Cho .................... H01L 25/0753 |

FOREIGN PATENT DOCUMENTS

| | | |
|---|---|---|
| CN | 106684098 A | 5/2017 |
| CN | 107170773 A | 9/2017 |
| CN | 107657900 A | 2/2018 |

\* cited by examiner

DRIVING BACKPLANE, MICRO-LED DISPLAY PANEL AND DISPLAY DEVICES

CROSS-REFERENCES TO RELATED APPLICATIONS

The present application is a continuation of International Application No. PCT/CN2018/098604 filed on Aug. 3, 2018, which claims priority to Chinese patent application No. 201820440383.8, filed on Mar. 29, 2018. Both applications are incorporated herein by reference in their entireties.

TECHNICAL FIELD

The present disclosure relates to a display technology.

BACKGROUND

A micro light-emitting diode (micro-LED) display device implements image display by display pixels which is an array of microscopic LED of high density integrated on a substrate. Like a large-sized outdoor LED display, each pixel of the micro-LED display can be addressed and individually driven to illuminate, so it can be regarded as a micro-sized outdoor LED display screen with a pixel pitch reduced from millimeters to microns. The micro-LED display device, which is self-emissive, has advantages of better material stability, longer service life, no image imprint and the like when compared with an OLED display device, and has more application potential.

There are various challenges associated with micro-LED manufacturing processes. New and improved techniques are desired.

SUMMARY

Based on the above, it is necessary to provide a driving backplane that can improve the product yield of the micro-LED display panel, a micro-LED display panel, and a micro-LED display device in view of the problem of how to improve the product yield of the micro-LED display panel.

A driving backplane of a micro-LED display panel includes a plurality of pixel units arranged in an array, each of the pixel units including: an anode lead; a cathode lead disposed at a side of the anode lead; and at least two pairs of electrodes, each pair of electrodes of the at least two pairs of electrodes including an anode and a cathode disposed opposite to each other, a first anode of a first electrode pair being electrically connected to a second anode lead of a second electrode pair, and a first cathode of the first electrode air being electrically connected to a second cathode lead of the second electrode pair.

In the course of using the foregoing driving backplane, it is only necessary to solder an LED chip on one pair of electrodes of the at least two pairs of electrodes. In the case of a defective LED chip, a normal LED chip can be soldered on one pair of electrodes of a remaining pair of electrodes, so as to repair an LED pixel and improve product yield of display panels.

In an embodiment, each pair of electrodes of the at least two pairs of electrodes is spatially independent from an adjacent pair of electrodes.

In an embodiment, the at least two pairs of electrodes are at least three pairs of electrodes.

In an embodiment, the at least two pairs of electrodes are three pairs of electrodes sequentially spaced apart.

In an embodiment, the pixel unit further includes a plurality of chip pads disposed on the at least two pairs of electrodes.

In an embodiment, the chip pad is provided on both the anode and the cathode of each pair of electrodes of the at least two pairs of electrodes.

In an embodiment, the anode lead is arranged perpendicular to the cathode lead.

In an embodiment, the driving backplane further includes an insulating film located between the positions where the anode lead and the cathode lead are superposed.

In an embodiment, the plurality of pixel units arranged in a same row share an anode lead.

In an embodiment, the plurality of pixel units arranged in a same column share a cathode lead.

The present disclosure further provides a micro-LED display panel comprising an LED chip and the above driving backplane, wherein two ends of the LED chip are respectively soldered onto the anode and the cathode of any pair of electrodes of the at least two pairs of electrodes.

In the course of using a micro-LED display panel of the present disclosure, a normal LED chip can be soldered onto one pair of electrodes of a remaining pair of electrode in the case of a defective LED chip, so as to repair an LED pixel and improve the product yield of the display panel.

In addition, The present disclosure further provides a micro-LED display, which includes the micro-LED display panel described above.

Since the micro-LED display device disclosed herein includes the foregoing micro-LED display panel, in the course of use, a normal LED chip can be soldered onto one pair of electrodes of a remaining pair of electrodes in the case of a defective LED chip, so as to repair the LED pixel and improve the product yield of display panels, thereby improving the product yield of the micro-LED display device.

DETAILED DESCRIPTION OF THE INVENTION

As mentioned above, there are various challenges associated with fabrication of micro-LED devices. In the preparation of the micro-LED display panel, LED chip arrays are transferred and soldered in batch onto a driving backplane. However, in the conventional processing of the micro-LED display panel, it is difficult to repair a defective LED pixel, resulting in a lower yield of display panels.

In order that the above objects, features and advantages of the present disclosure may be more clearly understood, specific embodiments of the present disclosure will be described in detail below with reference to the accompanying drawings. Numerous specific details are set forth in the following description in order to facilitate a thorough understanding of the present disclosure. The present disclosure can be embodied in many other ways than the description herein, and those skilled in the art can make similar modifications without departing from the spirit of the present disclosure, the disclosure is therefore not limited by the specific embodiments disclosed hereunder.

Figure 1:
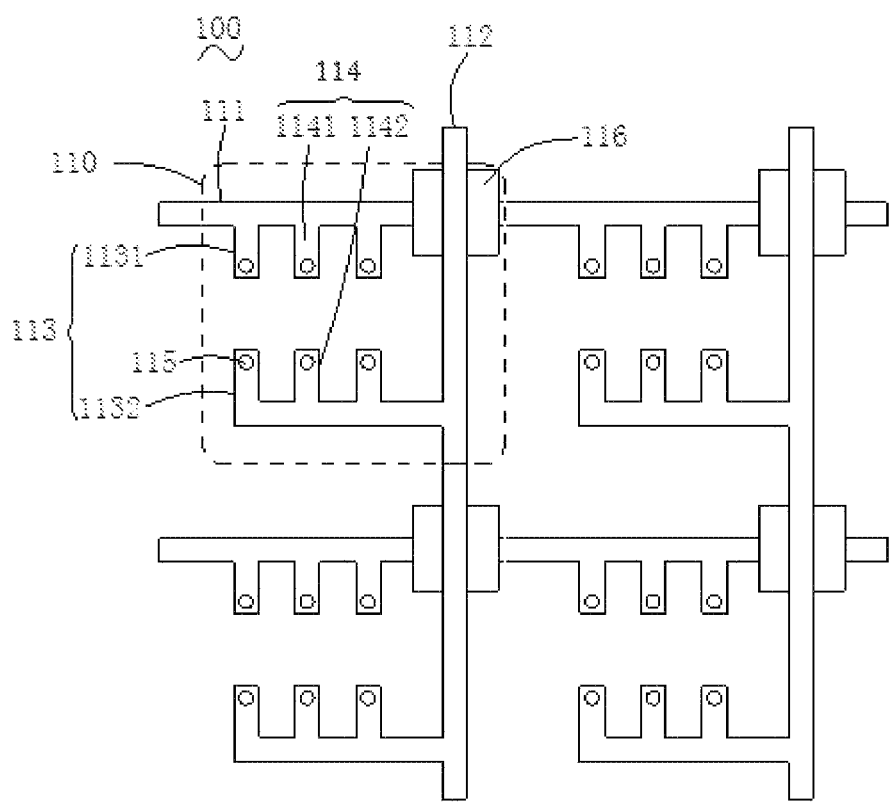
FIG. 1 is a schematic diagram of a driving backplane of a micro-LED display panel according to an embodiment of the present disclosure.

Referring to FIG. 1, a driving backplane 100 of a micro-LED display panel according to an embodiment includes a plurality of pixel units 110 arranged in an array. Each pixel unit 110 includes an anode lead 111, a cathode lead 112, and at least two pairs of electrodes.

The anode lead 111 and the cathode lead 112 are configured to transmit an electrical signal. The cathode lead 112 is located at a side of the anode lead 111.

Each pair of electrode includes an anode and a cathode disposed opposite to each other. The anode is electrically connected to the anode lead 111, and the cathode is electrically connected to the cathode lead 112. Each pair of electrode is spatially independent from an adjacent pair of electrodes, which can avoid damage to the adjacent pair of electrodes when an LED chip is soldered on pairs of electrodes.

For the purpose of explanation, in the present embodiment, a pair of electrodes subsequently soldered with LED chips is referred as the main pair of electrodes 113, and a pair of electrodes to be used subsequently as a backup is referred to as the backup pairs of electrodes 114. Definitely, the positions and the numbers of the main pair of electrodes 113 and the backup pair of electrodes 114 are not limited thereto.

The main pair of electrodes 113 includes a main anode 1131 and a main cathode 1132 disposed opposite to each other. The main anode 1131 is electrically connected to the anode lead 111, and the main cathode 1132 is electrically connected to the cathode lead 112.

The backup pair of electrodes 114 is configured to replace the main pair of electrodes 113. The backup pair of electrodes 114 includes a backup anode 1141 and a backup cathode 1142 disposed opposite to the backup anode 1141. The backup anode 1141 is electrically connected to the anode lead 111, and the backup cathode 1142 is electrically connected to the cathode lead 112.

Based on the foregoing embodiments, the at least two pairs of electrodes are at least three pairs of electrodes. As a result, more pairs of electrodes can be used as a backup, and a service life of the pixel unit 110 and the entire driving backplane 100 can be extended.

On the basis of the foregoing embodiments, the at least two pairs of electrodes are three pairs of electrodes arranged sequentially spaced apart. That is, there are two backup pairs of electrodes 114, and the main pair of electrodes 113 and the two backup pairs of electrodes 114 are sequentially spaced apart.

On the basis of the foregoing embodiments, the pixel unit 110 further includes a plurality of chip pads 115 on the at least two pairs of electrodes. The chip pad 115 is configured to solder the LED chip onto a pair of electrodes. As shown in FIG. 1, a chip pad 115 is provided on both the anode and cathode of each pair of electrodes.

Definitely, the LED chip may be soldered onto a pair of electrodes by other methods.

On the basis of the foregoing embodiment, the anode lead 111 is arranged perpendicular to the cathode lead 112, as shown in FIG. 1. Since the anode lead 111 and the cathode lead 112 are in perpendicular arrangement, a rectangular space is formed between the adjacent two anode leads 111 and the adjacent two cathode leads 112, which provides a more regular space for the arrangement of at least two pairs of electrodes of the pixel units 110, and facilitates orderly arrangement of the at least two pairs of electrodes. In addition, it further facilitates production and manufacture.

On the basis of the foregoing embodiment, the driving backplane 100 further includes an insulating film 116 located between the positions where the anode lead 111 and the cathode lead 112 are superimposed. The insulating film 116 prevents the anode lead 111 and the cathode lead 112 from being electrically connected.

On the basis of the foregoing embodiment, the plurality of pixel units 110 arranged in a same row share an anode lead 111. This arrangement processing may shorten the production time, thereby reducing the production cost.

On the basis of the foregoing embodiments, the plurality of pixel units 110 arranged in the same column share a cathode lead 112. This arrangement processing may shorten the production time, thereby reducing the production cost.

When the foregoing driving backplane is used, an LED chip may be soldered onto one pair of electrodes. If the LED chip is defective, a normal LED chip may be soldered onto one pair of electrodes of a remaining pair of electrodes, so that a LED pixel may be repaired and the product yield of display panels is improved.

Figure 2:
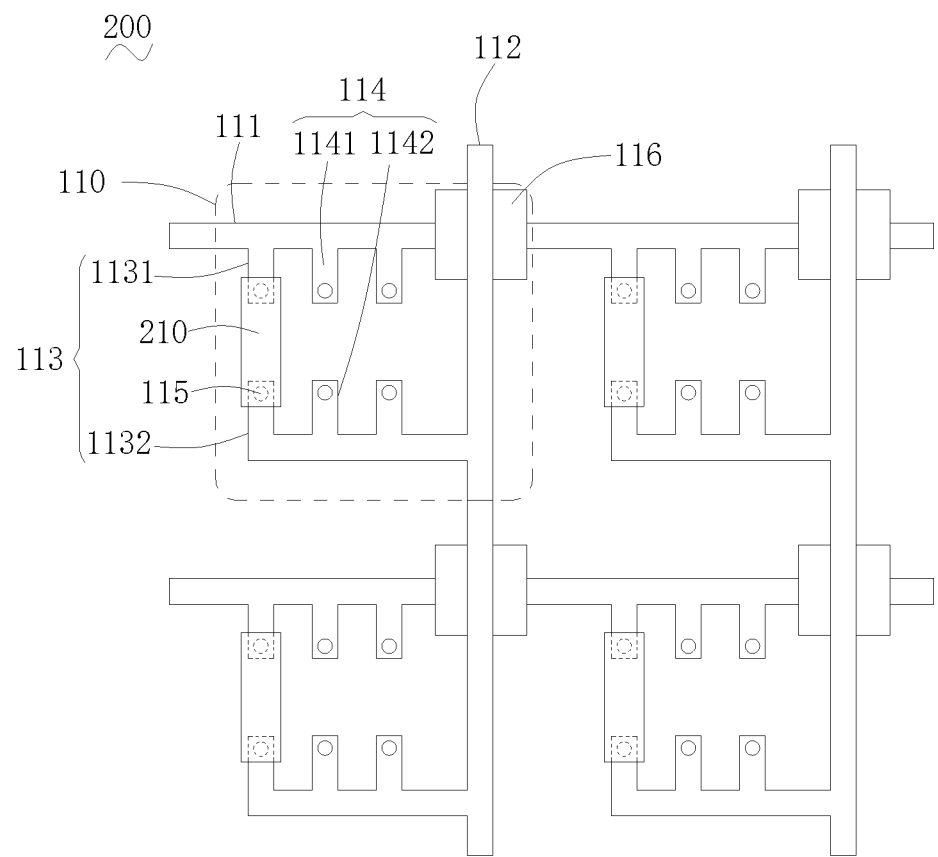
FIG. 2 is a schematic diagram of a micro-LED display panel according to an embodiment of the present disclosure.

Referring to FIG. 2, a micro-LED display panel 200 according to an embodiment includes an LED chip 210 and the above driving backplane 100. Both ends of the LED chip 210 are respectively soldered to the anode and the cathode of one pair of electrodes.

Figure 3:
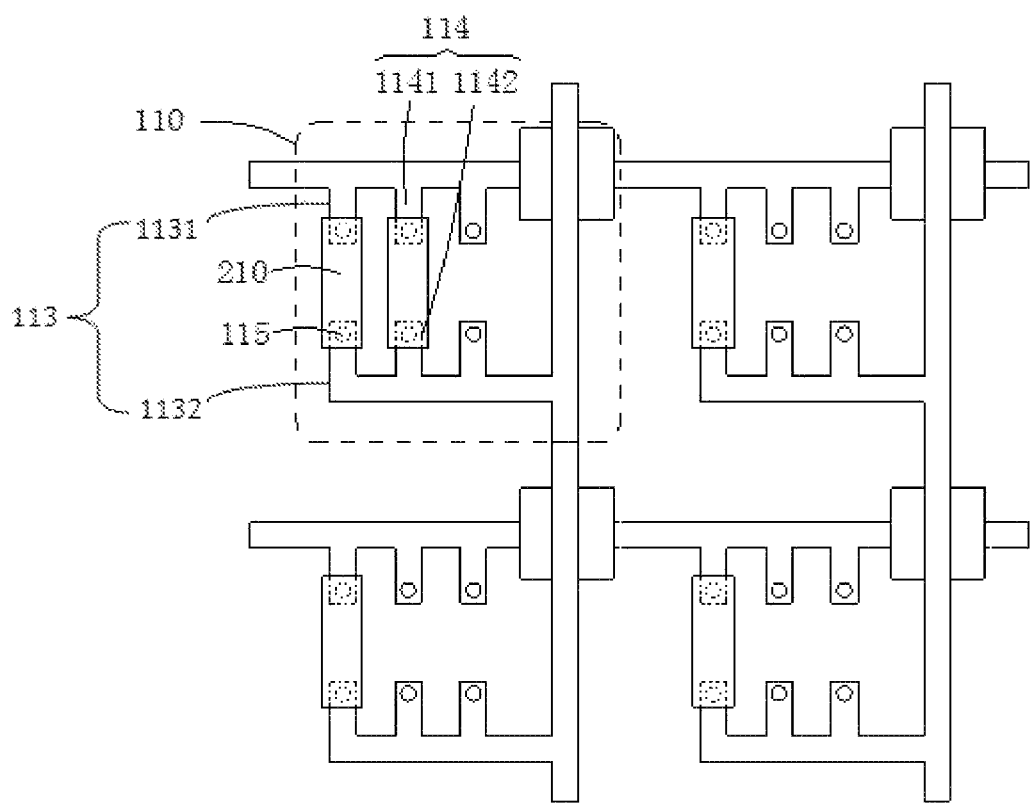
FIG. 3 is a schematic diagram of a micro-LED display panel using a backup pair of electrode according to an embodiment of the present disclosure.

Referring to FIG. 3, taking a defective LED chip 210 for a left pixel unit 110 of the driving backplane 100 of the micro-LED display panel as an example, the micro-LED display panel 200 of the present disclosure is used under following principle:

when the LED chip 210 soldered to the main pair of electrodes 113 is defective, it is only necessary to solder a normal LED chip onto one backup pairs of electrodes of backup pairs of electrodes 114, so that the LED pixel may be repaired. Specifically, the normal LED chip 210 may be soldered to the chip pads 115 of the backup anode 1141 and the backup cathode 1142.

Definitely, if the LED chip 210 for the other pixel units 110 is defective, the described method may also be adopted. It is only necessary to solder a normal LED chip on one backup pair of electrodes of the backup pairs of electrodes 114, so that the LED pixel may be repaired. If the LED chip soldered to the backup pair of electrodes 114 is defective, the normal LED chip may be then soldered onto one pair of electrodes of remaining backup pairs of electrodes 114. The above operation is simple and easy.

In the micro-LED display panel 200 of the present disclosure, if the LED chip 210 is defective in use, a normal LED chip can be soldered on one pair of electrodes of a remaining pair of electrodes, so as to repair the LED pixel and improve the product yield of the display panel.

The micro-LED display device according to an embodiment includes the micro-LED display panel described above.

Since the micro-LED display device of the present disclosure includes the micro-LED display panel 200 described above, if the LED chip 210 is defective in use, a normal LED chip may be soldered onto one pair of electrodes of a remaining pair of electrodes, so as to repair the LED pixel and improve the product yield of the display panel, and thereby improving the product yield of micro-LED display devices.

Each of technical features of the above-described embodiments may be combined arbitrarily. To simplify the description, not all of possible combinations of each of the technical features in the above embodiments are described. However, all of the combinations of these technical features should be considered as within the scope of the present specification, as long as such combinations do not contradict with each other.

The above embodiments merely illustrate several embodiments of the present application, and the description thereof is specific and detailed, but it shall not be constructed as limiting the scope of the present application. It should be noted that, for a person of ordinary skill in the art, several variations and improvements may be made without departing from the concept of the present application, and these are all within the protection scope of the present application. Therefore, the protection scope of the present application shall be subject to the appended claims.

The invention claimed is:

1. A driving backplane of a micro-LED display panel, comprises a plurality of pixel units arranged in an array, each of the pixel units comprising:
an anode lead;
a cathode lead disposed at a side of the anode lead; and
at least two pairs of electrodes, each pair of electrodes of the at least two pairs of electrodes including an anode and a cathode disposed opposite to each other, a first anode of a first electrode pair being electrically connected to a second anode lead of a second electrode pair, and a first cathode of the first electrode pair being electrically connected to a second cathode lead of the second electrode pair;
wherein each pair of electrodes of the at least two pairs of electrodes is spatially independent from an adjacent pair of electrodes of the at least two pairs of electrodes;
wherein a pair of electrodes to be soldered with an LED chip is a main pair of electrodes in the at least two pairs of electrodes, and a pair of electrodes to be used as a backup is a backup pair of electrodes in the at least two pairs of electrodes;
wherein the main pair of electrodes comprises a main anode and a main cathode disposed opposite to each other, the main anode is electrically connected to the anode lead, and the main cathode is electrically connected to the cathode lead;
wherein the backup pair of electrodes is configured to replace the main pair of electrodes, the backup pair of electrodes comprises a backup anode and a backup cathode disposed opposite to the backup anode, the backup anode is electrically connected to the anode lead, and the backup cathode is electrically connected to the cathode lead;
wherein the anode and the cathode in each pair of electrodes of the at least two pairs of electrodes extend toward each other in a line and do not overlap with each other in a thickness direction of the driving backplane.

2. The driving backplane according to claim 1, wherein the at least two pairs of electrodes are at least three pairs of electrodes.

3. The driving backplane according to claim 1, wherein the at least two pairs of electrodes are three pairs of electrodes sequentially spaced apart.

4. The driving backplane according to claim 1, wherein the pixel unit further comprises a plurality of chip pads disposed on the at least two pairs of electrodes.

5. The driving backplane according to claim 4, wherein the chip pads are provided on both the anode and the cathode of each pair of electrodes of the at least two pairs of electrodes.

6. The driving backplane according to claim 1, wherein the anode lead is arranged perpendicular to the cathode lead.

7. The driving backplane according to claim 6, wherein the driving backplane further comprises an insulating film located between the positions where the anode lead and the cathode lead are superposed.

8. The driving backplane according to claim 1, wherein the plurality of pixel units arranged in a same row share an anode lead.

9. The driving backplane according to claim 1, wherein the plurality of pixel units arranged in a same column share a cathode lead.

10. The micro-LED display panel comprises the LED chip and the driving backplane according to claim 1, wherein two ends of the LED chip are respectively soldered onto the anode and the cathode of any pair of electrodes of the at least two pairs of electrodes.

11. A micro-LED display device comprises the micro-LED display panel according to claim 10.

12. The driving backplane according to claim 1, wherein the LED chip is soldered on the main pair of electrodes of the at least two pairs of electrodes and along the line.

* * * * *